(12) United States Patent
Rocher

(10) Patent No.: US 7,385,384 B2
(45) Date of Patent: Jun. 10, 2008

(54) DIAGNOSIS METHOD FOR AN ANTENNA CONNECTION

(75) Inventor: Jacques Rocher, Saint-Orens (FR)

(73) Assignee: Continental Automotive France, Toulouse (FR)

( * ) Notice: Subject to any disclaimer, the term of this patent is extended or adjusted under 35 U.S.C. 154(b) by 619 days.

(21) Appl. No.: 10/529,762

(22) PCT Filed: Aug. 27, 2003

(86) PCT No.: PCT/EP03/09454

§ 371 (c)(1),
(2), (4) Date: Mar. 30, 2005

(87) PCT Pub. No.: WO2004/029639

PCT Pub. Date: Apr. 8, 2004

(65) Prior Publication Data

US 2006/0055395 A1    Mar. 16, 2006

(30) Foreign Application Priority Data

Sep. 30, 2002 (FR) .................................. 0212084

(51) Int. Cl.
*G01R 1/30* (2006.01)

(52) U.S. Cl. .................... 324/123 R; 324/102; 324/503
(58) Field of Classification Search ............ 324/123 R, 324/123 C, 124, 102, 118, 503, 522, 555, 324/509–512, 618

See application file for complete search history.

(56) References Cited

U.S. PATENT DOCUMENTS 5,371,508 A    12/1994    Teich et al.

FOREIGN PATENT DOCUMENTS

DE    198 20 207    11/1999

*Primary Examiner*—Bot LeDynh
(74) *Attorney, Agent, or Firm*—Young & Thompson

(57) ABSTRACT

A method for testing a reliable connection of an antenna includes a coil (L) or something similar connected to a reference potential on one side and to the output of an amplifier on the other side, a first capacitor (C2) arranged in a parallel position to the coil (1) and a second capacitor (C3) arranged between the terminal of the coil (1) and the reference potential. The method consists in emitting a signal by the amplifier, carrying out a first voltage measurement on the antenna terminal during a transient state, and in carrying out the second voltage measurement on the same antenna terminal in a steady-state condition. The method can be used for vehicle LF antennas.

15 Claims, 3 Drawing Sheets

DIAGNOSIS METHOD FOR AN ANTENNA CONNECTION

Figure 1:
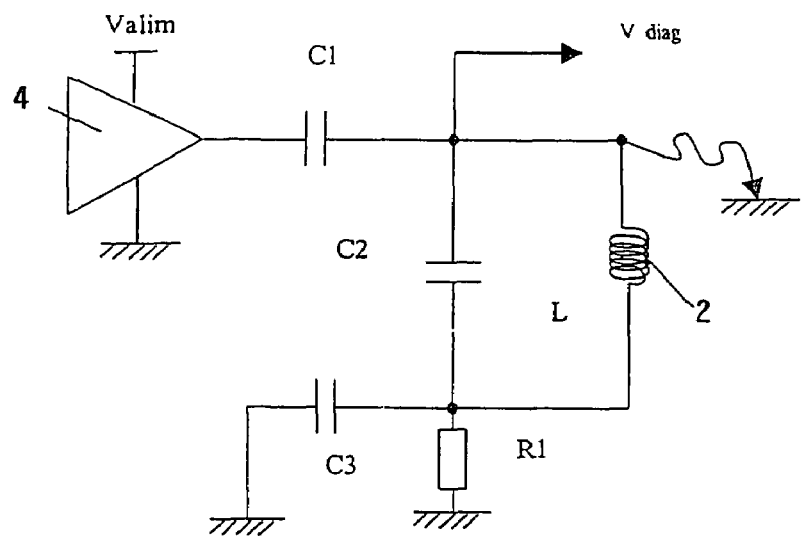

This application is a national stage filing under 35 U.S.C. 371 of International Application No. PCT/EP03/09454, filed Aug. 27, 2003, which claims priority from French Application No. 0212084, filed Sept. 30, 2002, the specification of which is incorporated herein by reference in its entirety.

The present invention relates to a diagnostic procedure relating to the connection of an antenna, in particular an antenna used for transmitting low frequency signals in a motor vehicle.

For a motor vehicle, the use of a low frequency (LF) antenna for dialog with an external badge or even for monitoring tire pressure is known.

In the first case, it is assumed that the vehicle is equipped with a hands-free system for accessing the vehicle and, where appropriate, for starting it without having to use a mechanical key. The user of the vehicle is then simply provided with a badge which is detected and recognized by a control and management device linked to antennas positioned on board the vehicle. If the badge is identified by the control and management device as being a badge authorized for the vehicle, the wearer of this badge can enter into the vehicle simply by grasping a door handle and, where necessary, start the engine of the vehicle simply by pressing a button.

For such a hands-free system, several LF antennas are provided. Each antenna is driven by a driver device, the latter, where necessary, driving a number of antennas. Normally, there are four drivers in a vehicle equipped with a hands-free access system (and, where appropriate, starting system): one driver for the antennas located outside the vehicle on its left-hand side, one for the external antennas located on the right, one for the external antennas located at the rear of the vehicle and a final one for the antennas located inside the vehicle.

In some vehicles equipped with a tire pressure monitoring system, an LF antenna is located in the vicinity of each wheel of the vehicle. These antennas are then each driven by a driver, which is in turn linked to a computer placed on board the vehicle.

One problem that arises when installing a hands-free system or a tire pressure monitoring system is how to check that each antenna is indeed linked to its driver. The latter is normally incorporated in a control and management computer inside the passenger compartment of the vehicle.

Document DE-198 20 207 describes a diagnostic device for an antenna. The diagnosis is provided by measuring an inductance. A signal is sent to the antenna and the phase difference between the excitation signal and the resonance voltage induced by this excitation is measured. The procedure then applied to check the correct connection of an antenna is relatively lengthy and complicated. Also, the results are not the same if one or more antennas are connected to one and the same driver. Furthermore, special equipment is needed to apply this procedure.

The object of the present invention is therefore to provide a procedure that is simple to implement for detecting the presence and satisfactory connection of an antenna to its control device. This procedure preferably detects whether the antenna being checked is presenting a short circuit to ground.

To this end, it proposes a diagnostic procedure relating to the connection of an antenna including a coil or similar linked on the one hand to a reference potential and on the other hand to an output of an amplifier, a first capacitor being mounted in parallel with the coil and a second capacitor being inserted between a terminal of the coil and the reference potential.

According to the invention, this procedure comprises the following steps:
a) transmission of a signal by the amplifier,
b) first measurement of the voltage at a terminal of the antenna during the transient state provoked by the transmission of the signal, and
c) second measurement of the voltage at the same terminal of the antenna in the steady state.

Although normally the measurements are performed in steady-state operation, the procedure proposed here entails taking a measurement in the transient state. This first measurement gives indications concerning the installation of the antenna and its connection. If only the second measurement is carried out, it is not possible to detect whether the antenna is connected or not. Of course, the voltage measured in the steady state is low in the first case whereas, when the antenna is disconnected, the measured voltage is relatively high, because the first capacitor is then charged. However, if the antenna is connected but presents a short circuit to ground, the second measurement, when carried out on its own, will report as its result that the connection is set up and correct. The first measurement during the transient state is then used to distinguish the case where the antenna is correctly connected from the case where it presents a short circuit to ground. In the first case, the first measurement gives a high voltage whereas, in the second case, the voltage measured on this first measurement is close to zero.

A diagnostic procedure according to the invention can, for example, be carried out on powering up the antenna.

Preferably, the signal sent by the amplifier to carry out the diagnostic is not modulated.

The signal at the amplifier output is, for example, a signal of the type presenting a rise time followed by a pulse duration and finally a fall time. In this case, the first measurement is preferably carried out during the rise time, for example in the second half of the signal rise. This first measurement can also be carried out right at the start of the pulse duration. The second measurement is, for example, carried out during the pulse duration.

The procedure according to the invention can also be adapted to diagnosing a number of antennas. Each antenna is then, for example, connected to an input stage of a multiplexer and a resistor positioned between the antenna and the input stage of the multiplexer limits the current in the corresponding multiplexer input stage.

Figure 2:
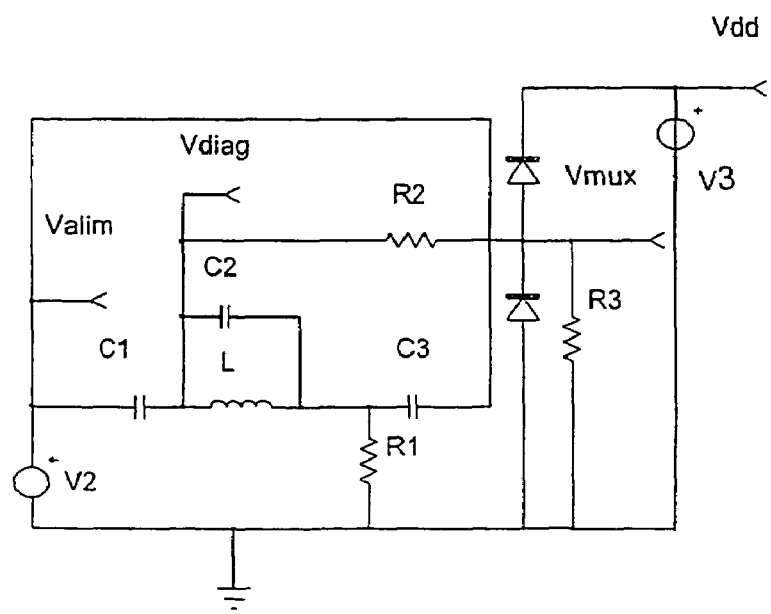
Figure 3:
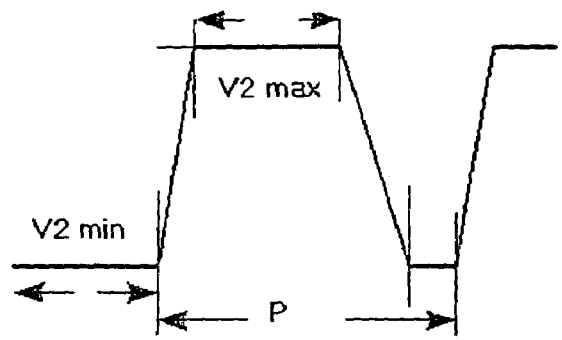
Figure 4:
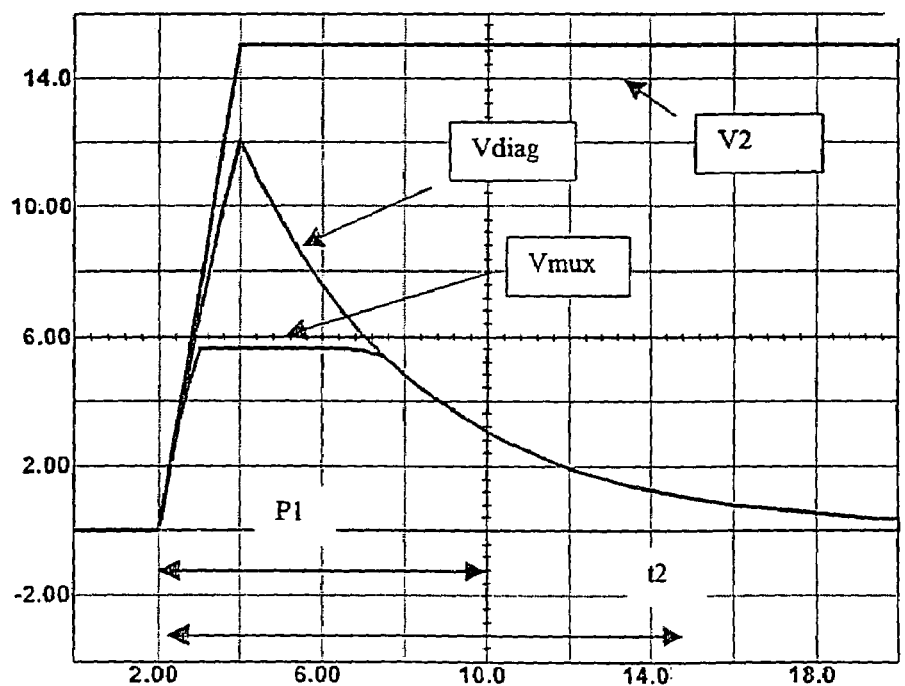
Figure 5:
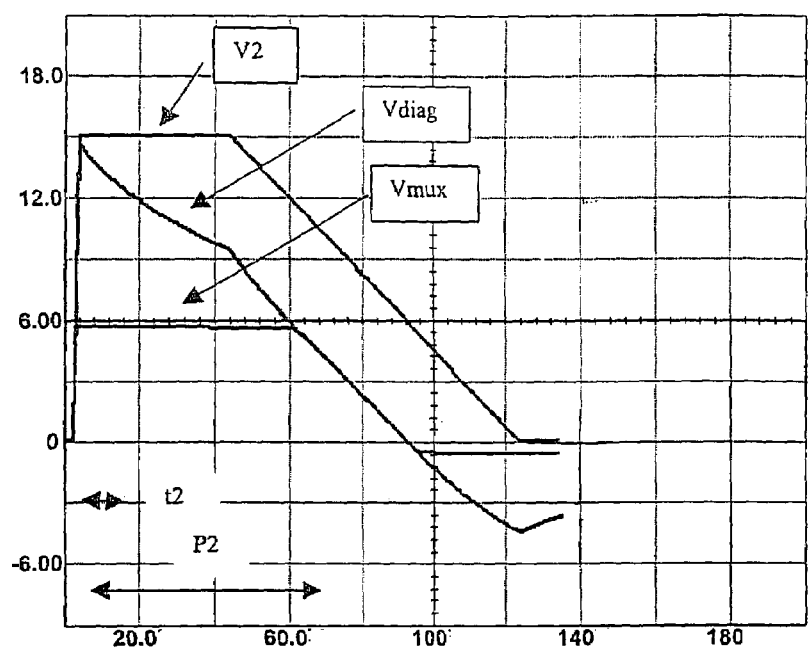
Figure 6:
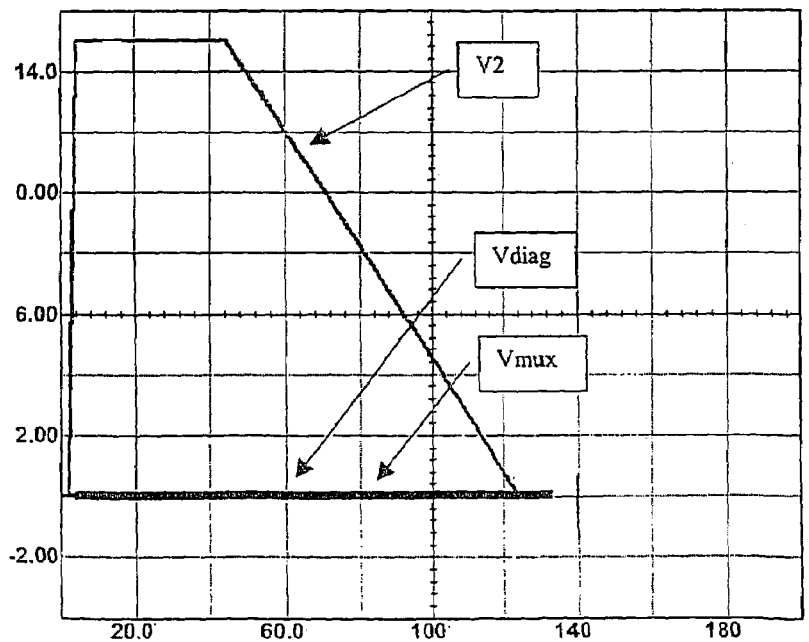

Other details and advantages of the present invention will become apparent from the description that follows, given with reference to the appended diagrammatic drawings, in which:

FIG. 1 is a schematic diagram of a circuit for implementing a procedure according to the invention, FIG. 2 is an electrical circuit diagram corresponding to the circuit of FIG. 1 associated with a read circuit, FIG. 3 is a diagram representing the shape of the signal sent to the antenna to check its connection, FIG. 4 is a diagram showing the shape of the different signals when the antenna is correctly connected, FIG. 5 corresponds to FIG. 4, with a different time scale, when the antenna is not connected, and FIG. 6 corresponds to FIG. 5 for an antenna connected but presenting a short circuit to ground.

The description provided below refers to an antenna installed on a motor vehicle and intended for use in a hands-free system, enabling a wearer of a badge to access the interior of the vehicle and, where appropriate, to start it without using a mechanical key. Such a system is known to those skilled in the art and is not described in detail here.

The description below considers a low frequency (LF) antenna designed to send signals at a frequency of 125 kHz. Naturally, the invention can also be applied to an antenna sending signals of different frequencies and for other applications.

Conventionally, a sinusoidal signal generator (in this case with a frequency of 125 kHz) supplies a carrier to a modulator. The latter receives from a management and control device the data that has to be transmitted by the antenna and "assembles" the signal from the generator with the data that it receives to supply the signal to be sent. This signal then passes into an amplifier device, commonly called a "driver". All these various elements are normally arranged inside the same box, or computer, placed, for example, on the dashboard of a vehicle. Only the antenna is positioned remotely from the box. This antenna is, for example, incorporated in a door handle or the trunk of the vehicle or else positioned inside the vehicle passenger compartment. The antenna is linked to the box, or computer, via a cable and connectors. Normally, a number of antennas are connected to one and the same box.

Numerous connections therefore need to be provided. The satisfactory operation of the hands-free system then depends on the quality of these connections. It is therefore important to check when installing that the connections are made correctly. FIGS. 1 and 2 show a diagnostic circuit for simply checking the presence (or detecting the absence) of an antenna while checking that the latter does not present a short circuit to ground or to positive.

FIG. 1 diagrammatically represents a coil 2 corresponding to the antenna discussed previously and an output amplifier 4 of the driver controlling this antenna. Three capacitors C1, C2 and C3 and a resistor R1 can also be seen in FIG. 1. These capacitors and this resistor, like the output amplifier 4, are located with the computer, for example inside the vehicle passenger compartment, while the coil 2 is located outside this computer.

The amplifier 4 is powered at a voltage Valim that is assumed, for example, to be equal to 24 V. The capacitor C1 is located at the output of this amplifier 4. Such a capacitor is almost always present at the output of an amplifier in the case of a transmitter. It is used to eliminate the DC component of the amplifier output signal in order to send a purely AC signal to the sending coil 2.

The capacitor C2 is mounted in parallel with the coil 2 whereas the capacitor C3 is mounted in series between the reference potential and the resonant circuit assembly formed by the capacitor C2 and the coil 2.

Thus, at the output of the amplifier 4, the three capacitors C1, C2 and C3 are mounted in series whereas the coil 2 is mounted in parallel with the capacitor C2.

The capacitor C2 reduces the current at the output of the amplifier 4. The signals sent to the antenna have a frequency of 125 kHz and the resonant circuit formed by the coil 2 of inductance L and the capacitor C2 presents a high impedance at this frequency.

The capacitor C3 protects the antenna from any short circuit that might occur on the positive terminal of the battery supplying the transmitter.

By way of nonlimiting example, a few numeric values are given below:

C1=C3=1 µF,

C2=37 nF,

L=38 µH

R1=2.2 kΩ.

FIG. 2 contains the same elements as those represented in FIG. 1 and described above. An input stage of a multiplexer is also represented on the right of this figure. This device is intended to measure the voltage vdiag read directly at the terminal of the coil 2 located alongside the amplifier 4, in other words the voltage (analog signal) prevailing between the capacitor C1 and the coil 2. Conventionally, to limit the input current in the multiplexer, a resistor R2 is provided. Such a multiplexer input stage is known to those skilled in the art. It mainly includes a power supply to the read circuit represented by a generator of a voltage V3. Diodes are provided to protect the read logic circuit. The input impedance of this circuit is symbolized by a resistor R3. The voltage given at the output by this logic circuit is called Vmux. It reflects the voltage Vdiag mentioned previously. The use of a multiplexer limits the number of input/outputs of the microprocessor used for the measurement.

By way of nonlimiting numerical example, there is, for example, a power supply voltage Vdd of 5 V with the following resistors:

R2=47 kΩ and R3=100 MΩ.

FIG. 3 shows an example of a signal that can power the coil 2 to provide a connection diagnostic. This signal first presents an initial value, for example zero. This period where the output voltage takes the initial value is followed by a rise time to reach a maximum value. A predetermined pulse duration is followed by a fall time to return to the initial value. This signal is, for example, a periodic signal of period P. By way of nonlimiting numerical example, the following values can be applied:

Rise time: 2 ms,

Pulse width: 40 ms,

Fall time: 80 ms,

Period: P=124 ms, including a 2 ms period in which the signal presents its initial value, Minimum value=0 V, Maximum value=15 V.

The operation of the diagnostic device is illustrated in FIGS. 4 to 6. These figures show the signal V2 at the amplifier output, the voltage Vdiag prevailing at a terminal of the coil 2 and the voltage Vmux measured by the measurement logic circuit.

In FIG. 4, it is assumed that the antenna is correctly connected to its driver, and that there is therefore no short circuit. The numerical information on the x and y axes is given purely by way of indication. On the x-axis, the values correspond to milliseconds, whereas on the y-axis, they represent Volts.

When the antenna is correctly connected, the coil 2 short circuits the capacitor C2. The resistor R1 is linked to ground. Because of this, the ground level rises to the point at which Vdiag is measured. During a transient state, the capacitors C1 and C3 are charged through R1 and then C3 is discharged.

This is evident from FIG. 4 in which the voltage Vdiag corresponds to the capacitor C3 charge. The voltage Vmux corresponds to the voltage Vdiag, but with peak clipping due to the presence of the protection diodes of the multiplexer input stage.

The diagnostic procedure according to the present invention proposes carrying out a first measurement at a time t1 at which the voltage Vmux is at its maximum or presents a value close to this maximum value. This first measurement is therefore performed during the transient state during which the capacitors C1 and C3 are charged and then discharged. This measurement must be performed during the period referenced P1 in FIG. 4. The procedure according to the invention then proposes carrying out a second measurement at a time t2 corresponding to a steady state when the capacitors are discharged. In the case of FIG. 4, the voltage Vmux is then close to zero.

FIG. 5 represents the Vdiag, Vmux curves relative to the voltage V2 in the case where the antenna is not connected, which then corresponds to the case where the coil 2 in FIGS. 1 and 2 would quite simply be removed. In this case, the three capacitors are mounted in series. These capacitors are charged during the rise time of the signal V2 and then discharged via the resistor R1. It will be noted here that the voltage Vmux remains maximum throughout the pulse width. Here, also, two measurements are carried out: a first during the transient state during which the capacitors are charged followed by a second measurement in the steady state in the pulse period. The period P2 symbolized in FIG. 5 corresponds to the period during which the second measurement is carried out.

Finally, FIG. 6 represents the case where a terminal of the antenna is directly linked by a short circuit to ground as symbolically represented in FIG. 1. In this case, the voltages Vdiag and Vmux remain zero. For the two measurements carried out, a voltage Vmux of zero is therefore obtained.

As can be seen, by providing for two measurements, one during the transient state and one later, the antenna connection fault can, where appropriate, be diagnosed. In practice, when the antenna is correctly connected, the voltage measured in the first measurement presents a high level and the voltage measured in the second measurement presents a low level. When the antenna is disconnected, the first measurement gives a high result as in the second measurement. Finally, when a short circuit to ground is present, both measurements carried out give a low level. The case of a short circuit to positive can also be considered. In this case, the two measurements carried out give a high level, which is therefore equivalent to diagnosing an absent antenna.

To obtain a correct diagnosis, it is obviously essential to choose carefully the times at which the measurements are carried out. In the present case, t1=5 ms and t2=15 ms are proposed as examples. These values naturally depend on the shape of the signal V2. The first measurement is carried out at the end of the rise time or right at the start of the pulse duration. In all cases, it will be noted that at this moment the state is transient. The second measurement is carried out when the state is steady. This measurement can, for example, be carried out toward the middle of the pulse duration during which V2 is at its maximum. It is essential for the second measurement to be carried out after the transient state, and this applies in all cases (antenna properly connected, antenna disconnected, short circuit to ground or to positive).

The diagnostic device described above used in conjunction with the procedure described can therefore be used to reliably detect an incorrectly installed antenna before using it. The measurement is carried out, for example, when the circuit is first powered up. The diagnosis can be obtained quickly and inexpensively.

The present invention is not limited to the embodiments described above by way of nonlimiting examples. It also relates to all variants within the scope of those skilled in the art, within the context of the following claims.

The invention claimed is:

1. A diagnostic procedure relating to the connection of an antenna including a coil (2) linked on the one hand to a reference potential and on the other hand to an output of an amplifier (4), a first capacitor (C2) being mounted in parallel with the coil (2) and a second capacitor (C3) being inserted between a terminal of the coil (2) and the reference potential, characterized in that it comprises the following steps:

a) transmission of a signal by the amplifier (4),
b) first measurement of the voltage at a terminal of the antenna during the transient state provoked by the transmission of the signal, and
c) second measurement of the voltage at the same terminal of the antenna in the steady state.

2. The diagnostic procedure as claimed in claim 1, characterized in that it is carried out on powering up the antenna.

3. The diagnostic procedure as claimed in claim 1, characterized in that the signal sent by the amplifier (4) is not modulated.

4. The diagnostic procedure as claimed in claim 3, characterized in that the signal at the amplifier (4) output presents a rise time, followed by a pulse duration and finally a fall time.

5. The diagnostic procedure as claimed in claim 4, characterized in that the first measurement is carried out during the rise time.

6. The diagnostic procedure as claimed in claim 4, characterized in that the second measurement is carried out during the pulse duration.

7. The diagnostic procedure as claimed in claim 1, characterized in that the antenna is connected to an input stage of a multiplexer and in that a resistor (R2) positioned between the antenna and the input stage of the multiplexer limits the current in the multiplexer input stage.

8. The diagnostic procedure of claim 5, wherein the first measurement is carried out during a second half of the signal rise.

9. The diagnostic procedure as claimed in claim 2, characterized in that the signal sent by the amplifier (4) is not modulated.

10. The diagnostic procedure as claimed in claim 5, characterized in that the second measurement is carried out during the pulse duration.

11. The diagnostic procedure as claimed in claim 2, characterized in that the antenna is connected to an input stage of a multiplexer and in that a resistor (R2) positioned between the antenna and the input stage of the multiplexer limits the current in the multiplexer input stage.

12. The diagnostic procedure as claimed in claim 3, characterized in that the antenna is connected to an input stage of a multiplexer and in that a resistor (R2) positioned between the antenna and the input stage of the multiplexer limits the current in the multiplexer input stage.

13. The diagnostic procedure as claimed in claim 4, characterized in that the antenna is connected to an input stage of a multiplexer and in that a resistor (R2) positioned between the antenna and the input stage of the multiplexer limits the current in the multiplexer input stage.

14. The diagnostic procedure as claimed in claim 5, characterized in that the antenna is connected to an input stage of a multiplexer and in that a resistor (R2) positioned between the antenna and the input stage of the multiplexer limits the current in the multiplexer input stage.

15. The diagnostic procedure as claimed in claim 6, characterized in that the antenna is connected to an input stage of a multiplexer and in that a resistor (R2) positioned between the antenna and the input stage of the multiplexer limits the current in the multiplexer input stage.

* * * * *